(12) United States Patent
Cao et al.

(10) Patent No.: US 7,619,280 B2
(45) Date of Patent: Nov. 17, 2009

(54) CURRENT SENSE TRENCH TYPE MOSFET WITH IMPROVED ACCURACY AND ESD WITHSTAND CAPABILITY

(75) Inventors: Jianjun Cao, Torrance, CA (US); Ying Xiao, El Segundo, CA (US); Kyle Spring, Temecula, CA (US); Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 248 days.

(21) Appl. No.: 11/066,178

(22) Filed: Jan. 31, 2005

(65) Prior Publication Data

US 2005/0174823 A1 Aug. 11, 2005

Related U.S. Application Data

(60) Provisional application No. 60/540,747, filed on Jan. 30, 2004, provisional application No. 60/540,501, filed on Jan. 30, 2004.

(51) Int. Cl.
*H01L 29/76* (2006.01)
(52) U.S. Cl. ..................................... 257/330
(58) Field of Classification Search ........................ None
See application file for complete search history.

(56) References Cited

U.S. PATENT DOCUMENTS

| 6,072,214 | A  | * | 6/2000  | Herzer et al. ............... 257/331 |
| 6,906,355 | B2 | * | 6/2005  | Kurosaki et al. ............ 257/127 |
| 2004/0222458 | A1 | * | 11/2004 | Hsieh et al. ................. 257/329 |
| 2005/0035398 | A1 | * | 2/2005  | Williams et al. ............ 257/329 |

* cited by examiner

*Primary Examiner*—Dao H Nguyen
*Assistant Examiner*—Tram H Nguyen
(74) *Attorney, Agent, or Firm*—Farjami & Farjami LLP (57) ABSTRACT

The active area of a current sense die is surrounded by a transition region which extends to the terminating periphery of the die. Spaced parallel MOSgated trenches extend through and define an active area. The trench positions in the transition region are eliminated or are deactivated, as by shorting to the MOSFET source of the trench, or by removing the source regions in areas of the transition region. By inactivating MOSgate action in the transition region surrounding the source, the device is made less sensitive to current ratio variation due to varying manufacturing tolerances. The gate to source capacitance is increased by surrounding the active area with an enlarged $P^+$ field region which is at least five times the area of the active region, thereby to make the device less sensitive to ESD failure.

4 Claims, 12 Drawing Sheets

21, P+ MASK, PATTERN REGION OPEN TO P+ IMPLANT

25, SENSE DIE ACTIVE MASK, SHADE REGION SHOWS THE ACTIVE AREA OF SENSE DIE

FIG.1d

TRENCHES

POLY-SILICON GATE RUNNER

TRENCHES
FIG.5b

SENSE DIE ACTIVE MASK AND SOURCE MASK
SHADE REGION SHOWS THE ACTIVE AREA OF SENSE DIE

FIG.9b
SENSE DIE ACTIVE MASK, SHADED BLOCK SHOWS THE ACTIVE AREA OF A SENSE DIE

FIG.9c
ACTIVE AREA AND P+ FIELD OF A SENSE DIE P+ AREA: ACTIVE AREA = 5.4

CURRENT SENSE TRENCH TYPE MOSFET WITH IMPROVED ACCURACY AND ESD WITHSTAND CAPABILITY

RELATED APPLICATION

This application claims the benefit of U.S. Provisional Application No. 60/540,747, filed Jan. 30, 2004 and U.S. Provisional Application No. 60/540,501, filed Jan. 30, 2004.

FILED OF THE INVENTION

This invention relates to semiconductor devices and processes for their manufacture and more specifically relates to current sense MOSFETs of a trench type topology and processes of their manufacture for improved accuracy (reduced sense ratio variation) and improved electrostatic discharge (ESD) withstand capability.

BACKGROUND OF THE INVENTION

A first feature of the present invention deals with the variation of the current sense ratio variation which is encountered in trench type current sense MOSFETs.

In a current sensing MOSFET, a small fraction of the total active area of a power MOSFET is employed to sense the current through an independent source terminal. The current sense ratio is the ratio of current conducted through the main FET and the sense die, which is basically determined by the ratio of effective current conduction areas. In many applications, a sense ratio as high as 5,000-15,000 is required, which needs a proportionally small active area for conducting the sense current. Compared to the small active area (e.g., 20 µm$^2$) in a sense die, the peripheral region of the active area is relatively large (e.g., 40% of the active area). Because the amount of current conducted in the peripheral region is subject to variation due to a number of processing or manufacturing steps, it is difficult to produce current sense MOSFETs with low sense ratio variation. Moreover, reducing the cell pitch poses increased challenges in controlling sense ratio variation.

It would be very desirable to provide a trench structure and process that can reduce the variability in the current sense ratio in die of different wafers and even of die from a common wafer.

A second problem dealt with by the present invention is the reduced ability of the small current sense die (or die areas) to withstand electrostatic discharge (ESD) destruction.

Electrostatic discharge destruction of a MOSFET occurs when the voltage across two pins induced by static charge is high enough to damage the dielectric thin film of the device. For a certain amount of charge superimposed across a capacitor, the lower the capacitance value is, the higher the voltage across the capacitor will be. As the active area of a MOSFET decreases, the capacitance decreases, and the sensitivity of a MOSFET to ESD increases.

In a current sensing MOSFET, a small fraction of the total active area is employed to sense the current through an independent source terminal. In a high sense ratio current sensing MOSFET (e.g. sense ratio of 10,000 or more), the active area of a sense die is proportionally smaller than that of the main FET, and the gate-to-source sense pin capacitance of the sense die is also proportionally smaller (e.g. approximately 10,000 times smaller) than that of the main FET. (Note that the source of the sense die is the current sense pin.) The small gate-to-source (sense pin) capacitance makes a current sense die prone to ESD damage. The yield of a current sensing MOSFET wafers is often decreased due to ESD damage. ESD destruction of the device is also a reliability risk.

In order to protect a current sensing MOSFET from ESD destruction, a Zener diode across gate-to-source (sense pin) is often integrated in the die at the cost of increased processing steps.

It would be desirable to improve the ESD withstand capability of current sensing MOSFETs without added process costs.

BRIEF DESCRIPTION OF THE INVENTION

In accordance with a first feature of the invention, and to reduce current sense ratio variation, current conduction through the periphery of the active area of the trench sense die is reduced.

In one embodiment of this invention the poly-silicon inside the trenches in the transition region surrounding the active area is set to source potential instead of gate potential by disconnecting these trenches from the poly gate bus and connecting them to the source metal. These peripheral trenches will never turn on as their "gates" are grounded to the source potential.

In a second embodiment of this invention, the trenches in the peripheral region surrounding the active area in a sense die are removed.

In a third embodiment of this invention a source mask is added to define the N+ source region exclusively within the active area of a sense die. The peripheral MOS trenches will not then turn-on due to the lack of a source layer.

Thus, sense ratio variation due to fabrication steps, especially in a trench MOSFET, and with low cell pitch devices, is reduced. Important benefits include reduced sense ratio variation in fabrication lots and over different gate voltages.

In a further embodiment of the invention, and in order to increase the ESD capability of the small current sense MOSFET die, the gate-to-source (between gate pin and sense pin) capacitance of the sense die is increased without increasing the active area of the sense die. Thus, in a current sensing MOSFET, the active area of the sense die is determined by the required sense ratio. In the periphery of the sense die, there is a P+ field region surrounding the active area. The P+ region is part of the termination that isolates the active area of the sense die from the active area of the main FET. The typical area of this P+ region is less than 2 times the active area of the sense die.

In accordance with the invention the P+ region is enlarged to greater than 5 times of the active area of a sense die. The enlarged P+ region then increases gate-to-source (sense pin) capacitance. In addition, adding trenches in the enlarged P+ region will further increase gate-to-source (sense pin) capacitance of the sense die.

The important benefit of this aspect of the invention is improved ESD withstand capability of a current sensing MOSFET without additional processing steps.

BRIEF DESCRIPTION OF THE DRAWINGS

FIG. 2 shows a cross-section of FIG. 1a taken across section line 2-2 in FIG. 1a.

FIG. 3b shows the arrangement of parallel trenches for the embodiment of FIG. 3a.

FIG. 4 shows a cross-section of the structure of FIG. 3a taken across section line 4-4 in FIG. 3a.

FIG. 6 is a cross-sectional view of FIG. 5a taken across section line 6-6 in FIG. 5a.

FIG. 7b is a top view of the sense die active mask and source mask for the device of FIG. 7a.

FIG. 8 is a cross-sectional view of FIG. 7a taken across section line 8-8 in FIG. 7a.

DETAILED DESCRIPTION OF THE PREFERRED EMBODIMENTS

Figure 1A:
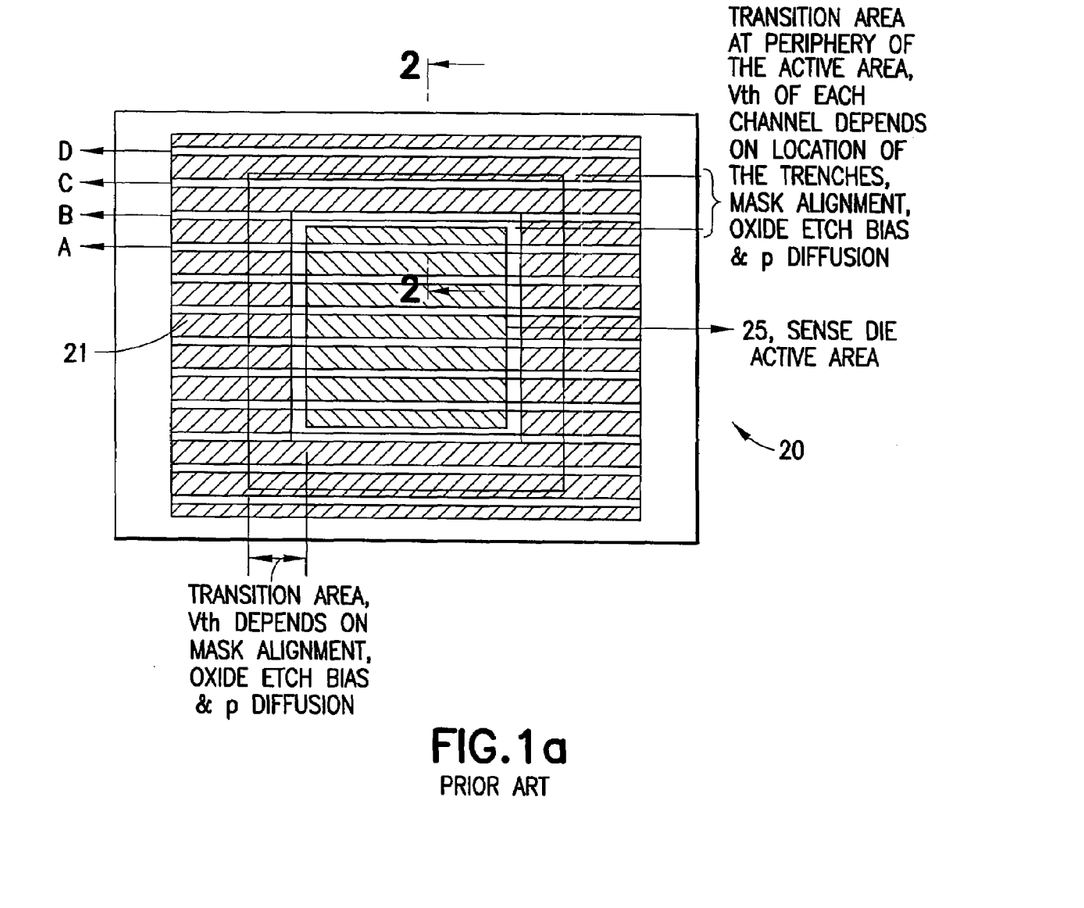
FIG. 1*a* is a top view of a prior art current sense chip.

FIG. 1a is a top view of a prior art sense die design 20. The sense die is shown as an N channel device, but it is to be understood that it can be a P channel device with all conductivity types reversed from those described. The active area 25 of the sense die 20 is isolated from the main FET by a P+ region 21 defined by the P+ mask 22 of FIG. 1b. The P+ mask 22 defines an open area 23 in the field oxide for boron implantation. The P+ mask has a certain overlap with the active mask 24 (FIG. 1c) that defines the open area for channel and source implantation. The active area 25 of the sense die 20 is inside the active mask 24. The periphery of active area 25 constitutes the transition from active area to the P+ field 21.

Figure 1B:
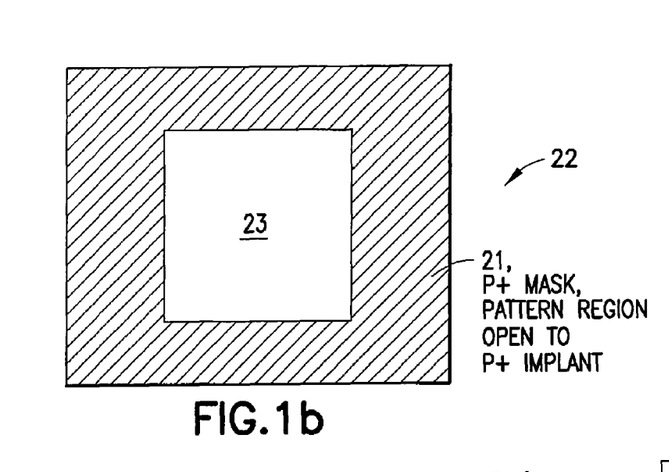
FIG. 1*b* is a top view of the P+ mask pattern with an opening shown in cross-hatch for a P+ transition implant in the die of FIG. 1*a*.
Figure 1C:
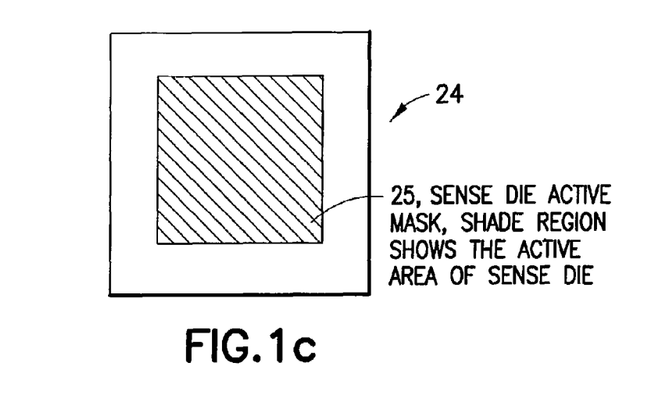
FIG. 1*c* is a top view of the die active mask for the device of FIG. 1*a*.
Figure 1D:
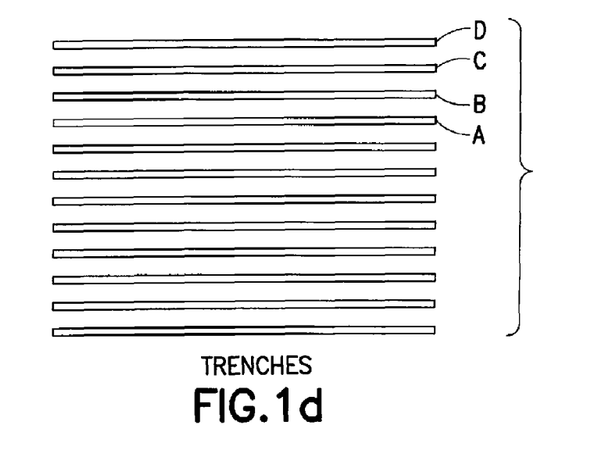
FIG. 1*d* shows the spaced parallel gate trenches which extend across the transition and active area in FIG. 1*a*, where any desired number of trenches can be used.
Figure 1E:
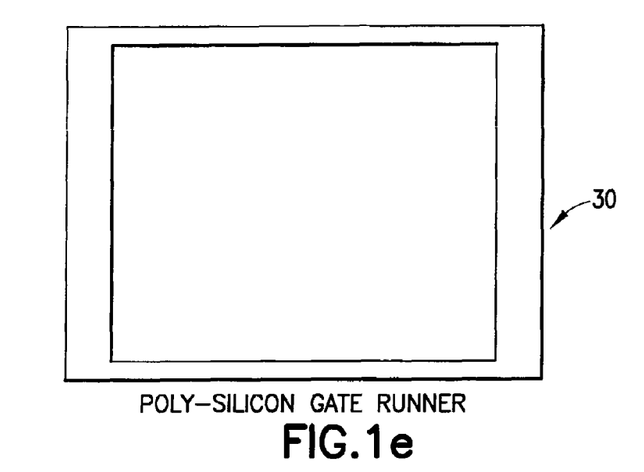
FIG. 1e shows the polysilicon gate runner for the MOS-gates in the trenches of FIG. 1.

In the example shown in FIG. 1a, trench A FIG. 1d is located at the active area 25, trenches B and C are located at the transition region from active area 25 to the P+ field 21, and trench D is located at the P+ field 21 without overlap with the active mask 23. Trenches A, B, C and D are shown for descriptive purposes only and obviously any desired number of trenches can be used, with any desired pitch. A poly silicon gate mask 30 (FIG. 1e) is proved for connection to the polysilicon gates to be described.

At the transition region the doping concentration (as well as channel threshold voltage) is affected by P carrier diffusion, mask alignment tolerance, and etch bias of oxide in which opening 23 is formed. Such manufacturing variences in the transition area causes sense ratio variation within a given fabrication lot or within a given wafer, and at different gate voltages.

Figure 2:
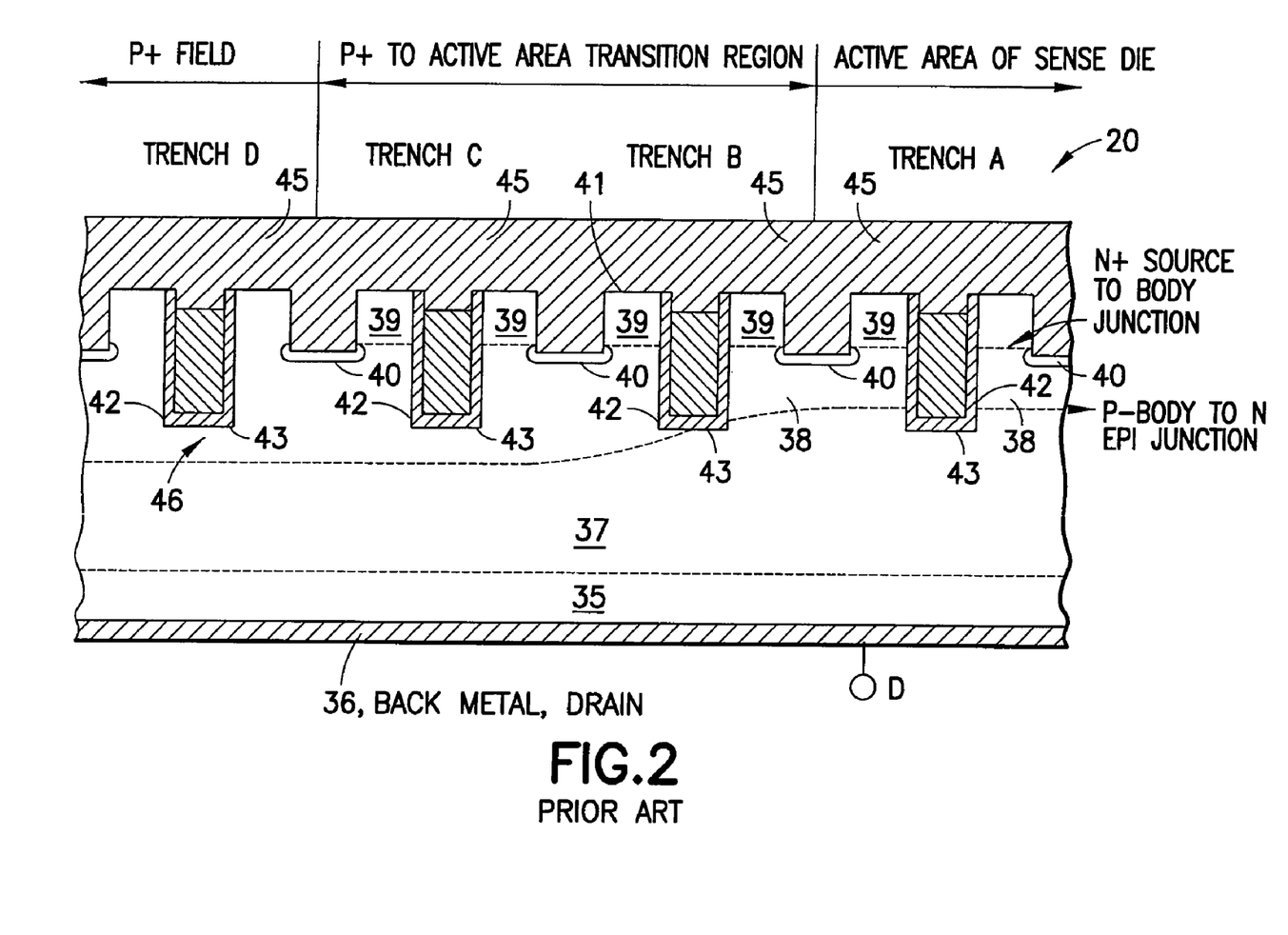

In FIG. 2, the wafer (die) 20 is formed on an N+ substrate 35 to which a bottom drain electrode 36 is affixed. (The wafer may be P+ and all other conductivity types reversed for P channel device.) An N– epi region 37 is grown atop wafer 35. A P body implant and diffusion forms the P body 38 and an N+ implant and diffusion forms the source 39. Trenches A, B, C and D are conventionally formed in the die 20 surface as shown. Shallow P+ contact regions 40 are formed in trenches which receive source electrode 41 extensions between trenches A, B, C and D.

Trenches A, B, C and D are conventionally lined with gate oxide 42 and are conventionally filled with conductive polysilicon gates 43 which are connected (not shown) to the polysilicon runner formed by mask 30 of FIG. 1c. An oxide interlayer 45 fills the tops of trenches A, B, C and D to insulate polysilicon gates 43 from source electrode 41. The deepened P+ field of region 21 in FIG. 1a is shown in FIG. 2 as diffused P+ region 46.

A trench A in FIG. 1a is shown in FIG. 2 as a typical active trench formed with gate, N+ source, P base, N drift region (epi) and substrate (drain). Trenches B and C are in the transition region of the periphery of the active area 25. The peak channel doping concentration and the junction depths of trenches B and C are larger than that of trench A. As a result the trenches B and C have higher threshold voltage depending on the exact locations of the boundary of the open window 23 for the P+ implant and the boundary of the open window for channel/source implant (FIG. 1b, 1c). In practice the edges of these implant windows are further subject to variation of the wet oxide etch. Trench D has no N+ source because it is located outside of source implant window defined by the active mask 24. Thus, trench D does not conduct current. Trenches B and C are the contributing elements of sense ratio variation induced by process uncertainty. The smaller the pitch (trench spacing) is, the more trenches will be located within the transition area, and the higher the uncertainty of sense ratio will be.

The present invention minimizes the current conductef at the periphery of active area 25 of sense die. A number of methods can be used. These methods include connecting the poly gate 43 to source metal 41 for peripheral trenches; removing the peripheral trenches; and adding a source confinement mask for peripheral trenches. Other techniques can be used. As a result, sense ratio variation over different threshold voltages Vgs, and within a fabrication lot and from lot to lot is reduced.

FIGS. 3a, 3b, 3c and 4 show a first preferred embodiment of the invention.

Figure 3A:
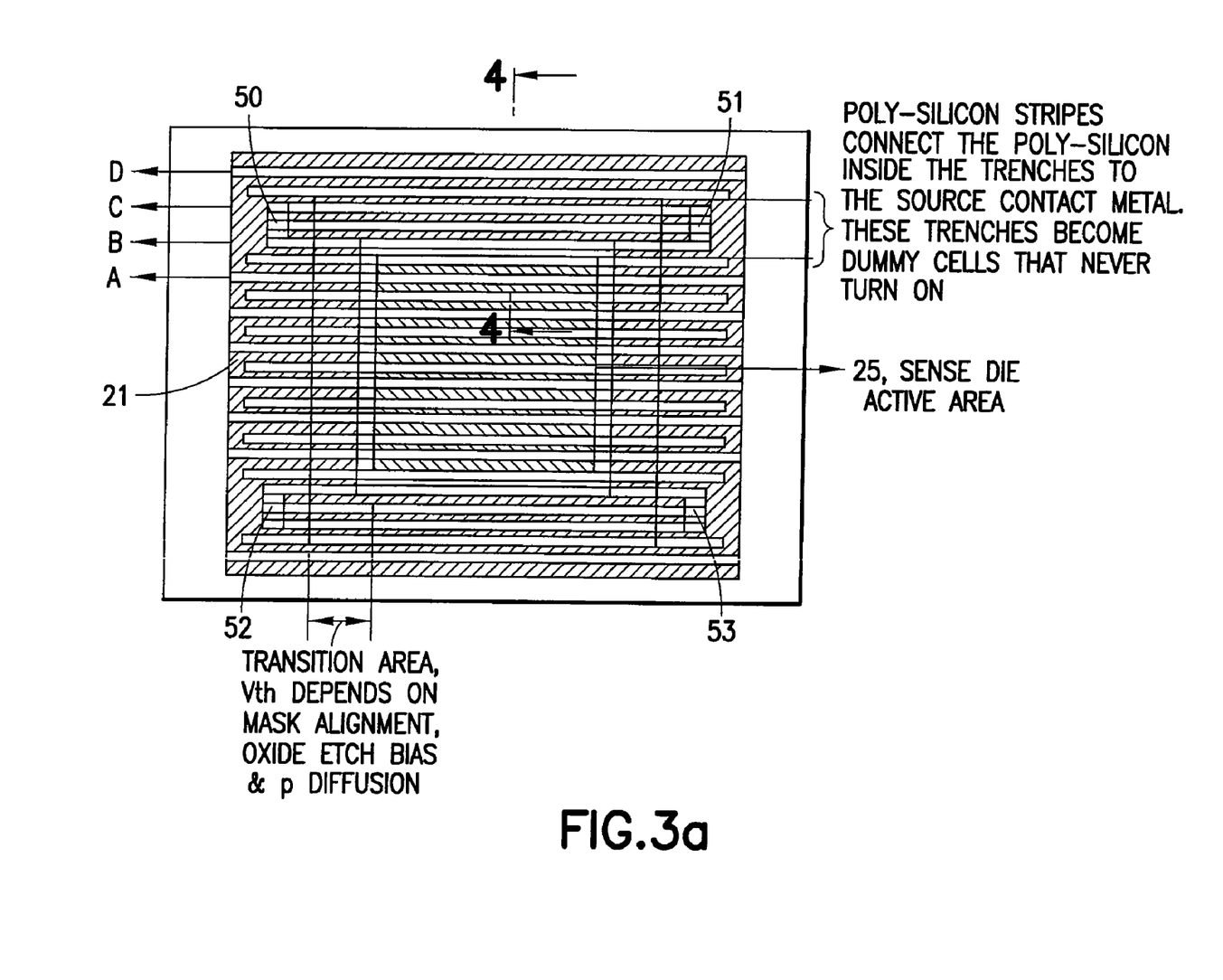
FIG. 3a is a top view of a first embodiment of the invention in which selected trenches in a selected width of the transition area are connected to the source and are thereby disabled.
Figure 3B:
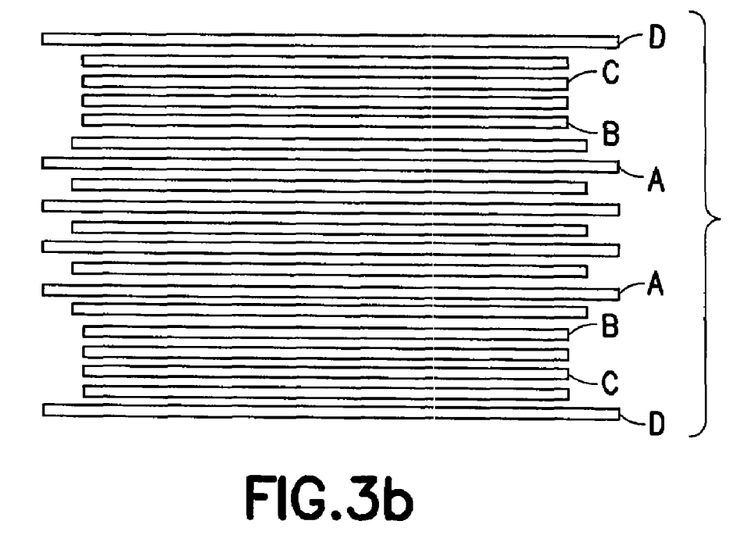
Figure 3C:
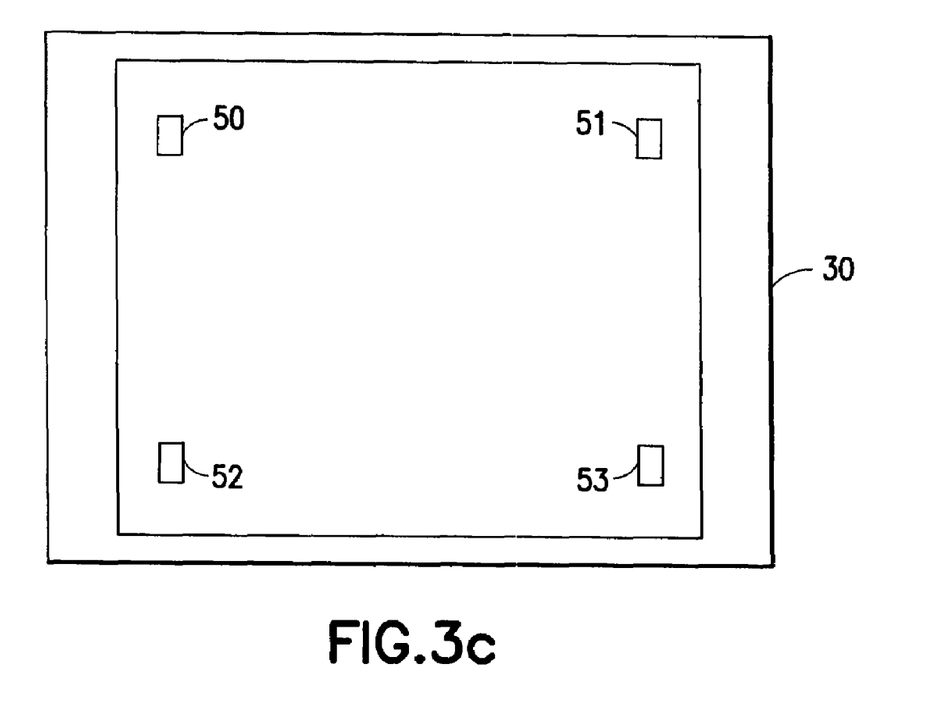
FIG. 3c shows the polysilicon pattern for the embodiment of FIGS. 3a and 3b.
Figure 4:
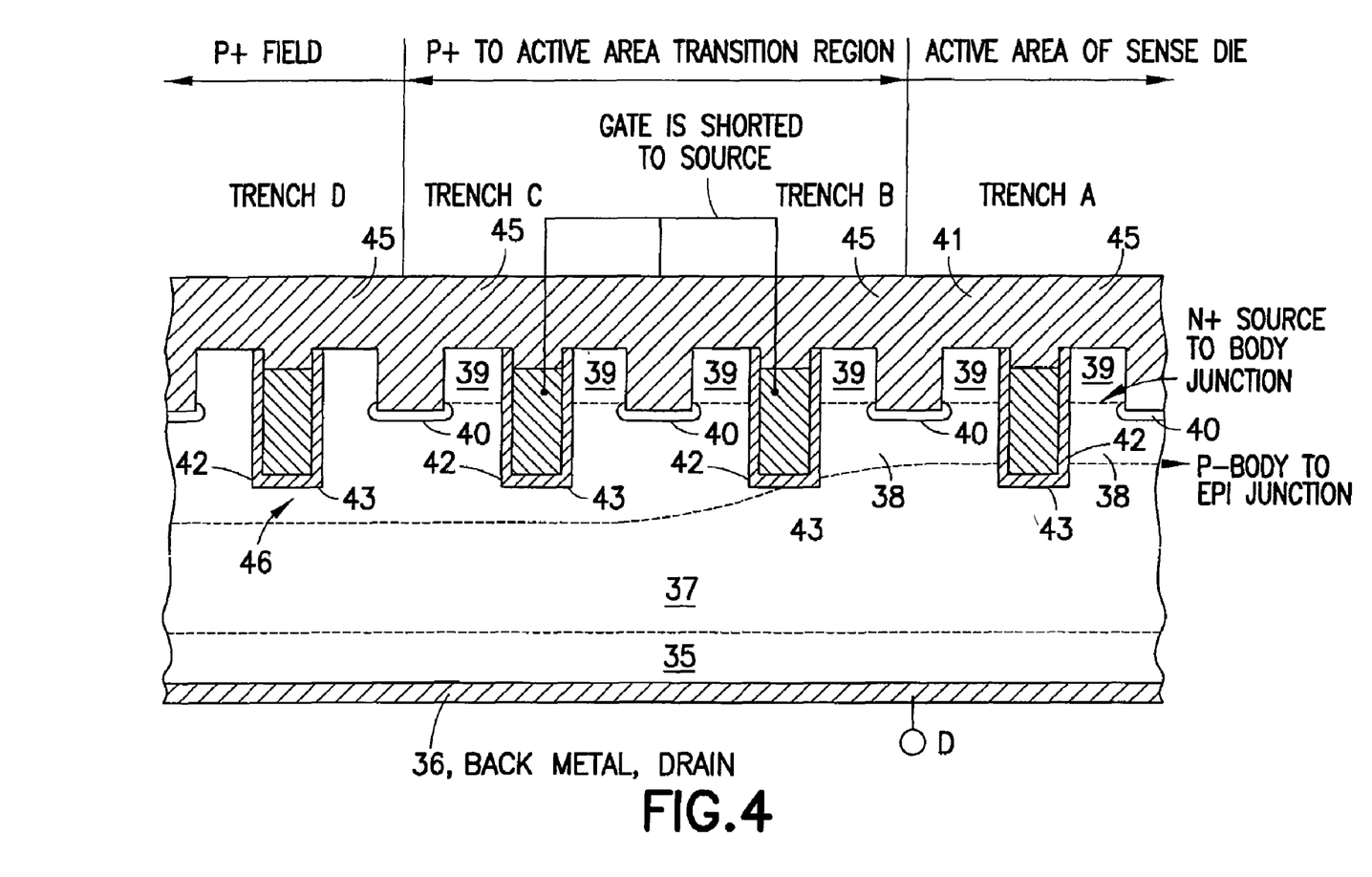

The trenches B and C (FIG. 3b) at the periphery of the active area of sense die 20 are disconnected from the polysilicon gate runner 30, and 4 pieces of poly-silicon strips 50, 51, 52 and 53 (FIG. 3c) are used to connect the poly-silicon inside the trenches to the source metal. FIG. 4 illustrates the corresponding cross-sectional view of trenches A, B, C and D, where the poly-silicon gate 43 of trenches B and C is connected to the source metal 41. In the prior art shown in FIG. 1, the poly-silicon inside all the trenches are connected to the same poly-silicon gate runner, so that the peripheral trenches conduct variable amount of current depending upon the gate drive voltage and processing conductions. The invention as shown in FIGS. 3a and 4 prevents the trenches C and D in the periphery to conduct any current because the "gate" and source of the trenches are at the same potential.

Figure 5A:
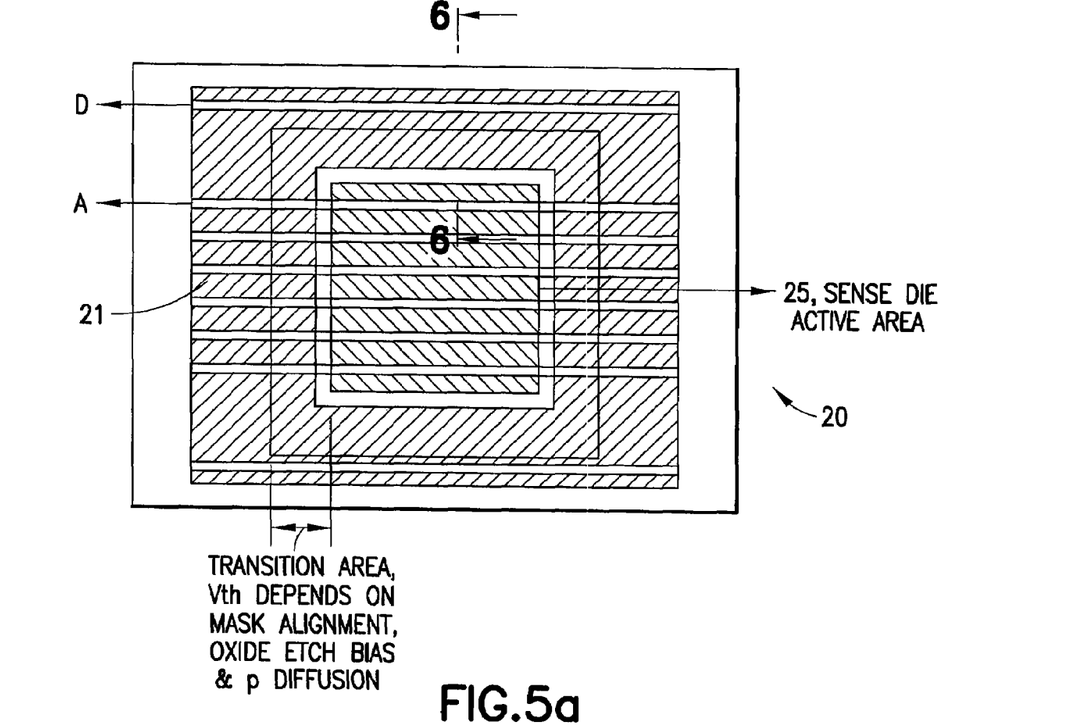
FIG. 5a is a top view of a current sense die according to a second embodiment of the invention.
Figure 5B:
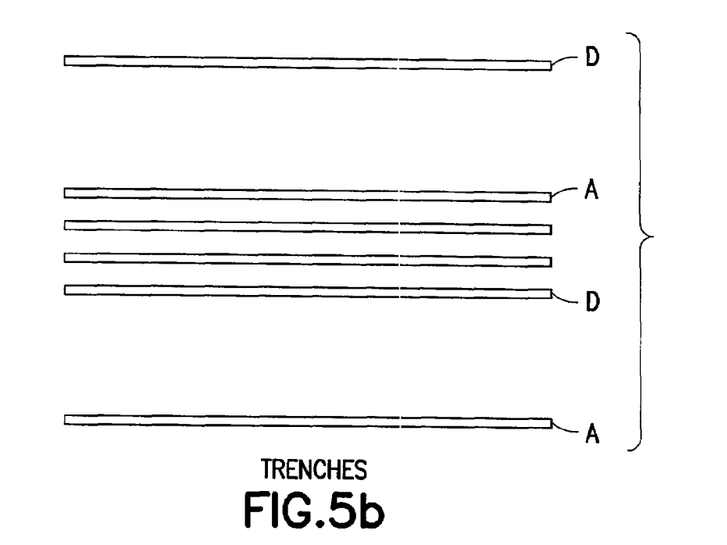
FIG. 5b shows a typical trench arrangement for FIG. 5a in which selected trenches are removed from the transition area.
Figure 6:
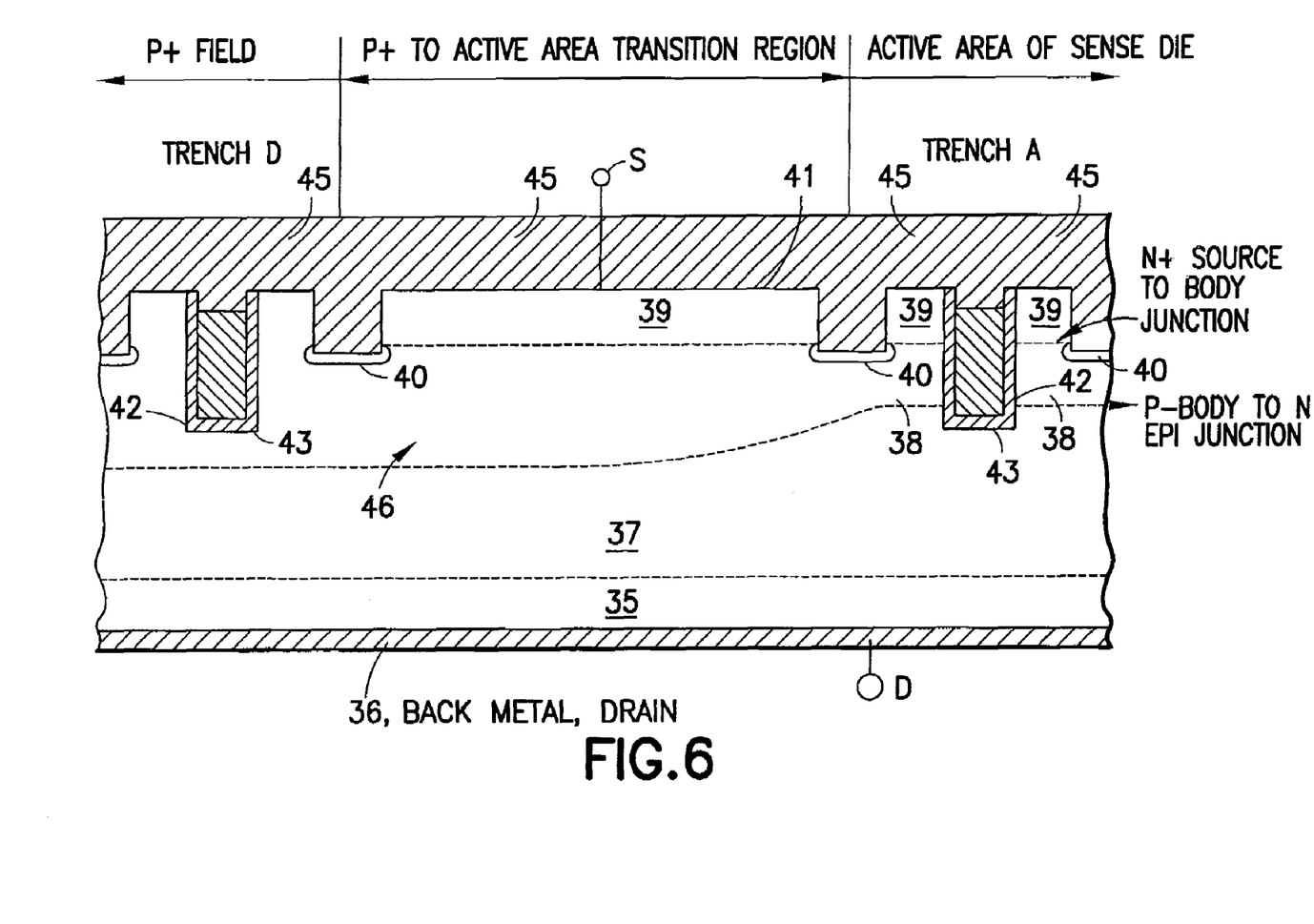

FIGS. 5a, 5b and 6 show another embodiment of this invention with the peripheral trenches B and C removed. FIG. 6 shows the cross-sectional view of this embodiment with trenches B and C removed. The results will be the same as for FIGS. 3a and 4, i.e., no additional current conduction will take place through the peripheral trenches of the sense die.

Figure 7A:
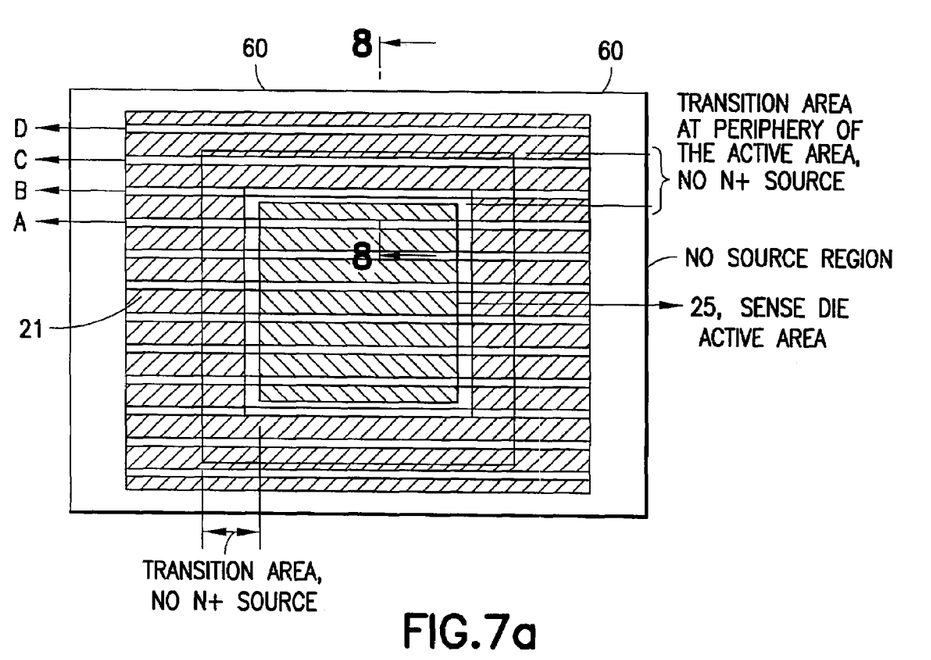
FIG. 7a is a top view of a current sensing die according to a third embodiment of the invention.
Figure 7B:
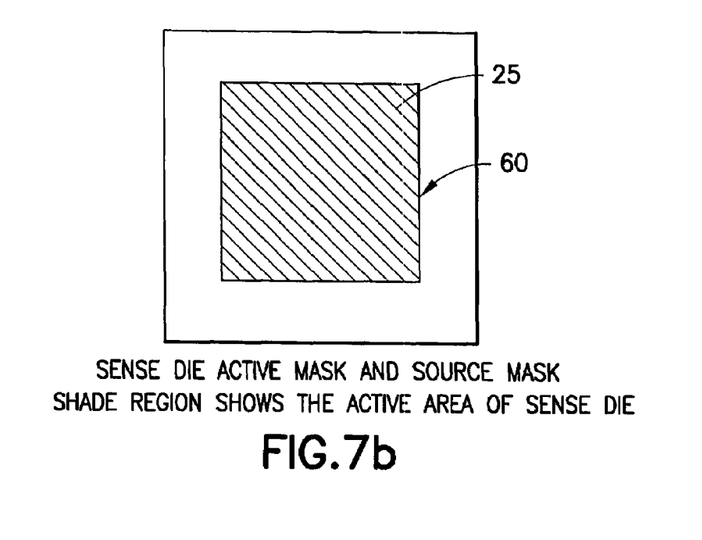
Figure 8:
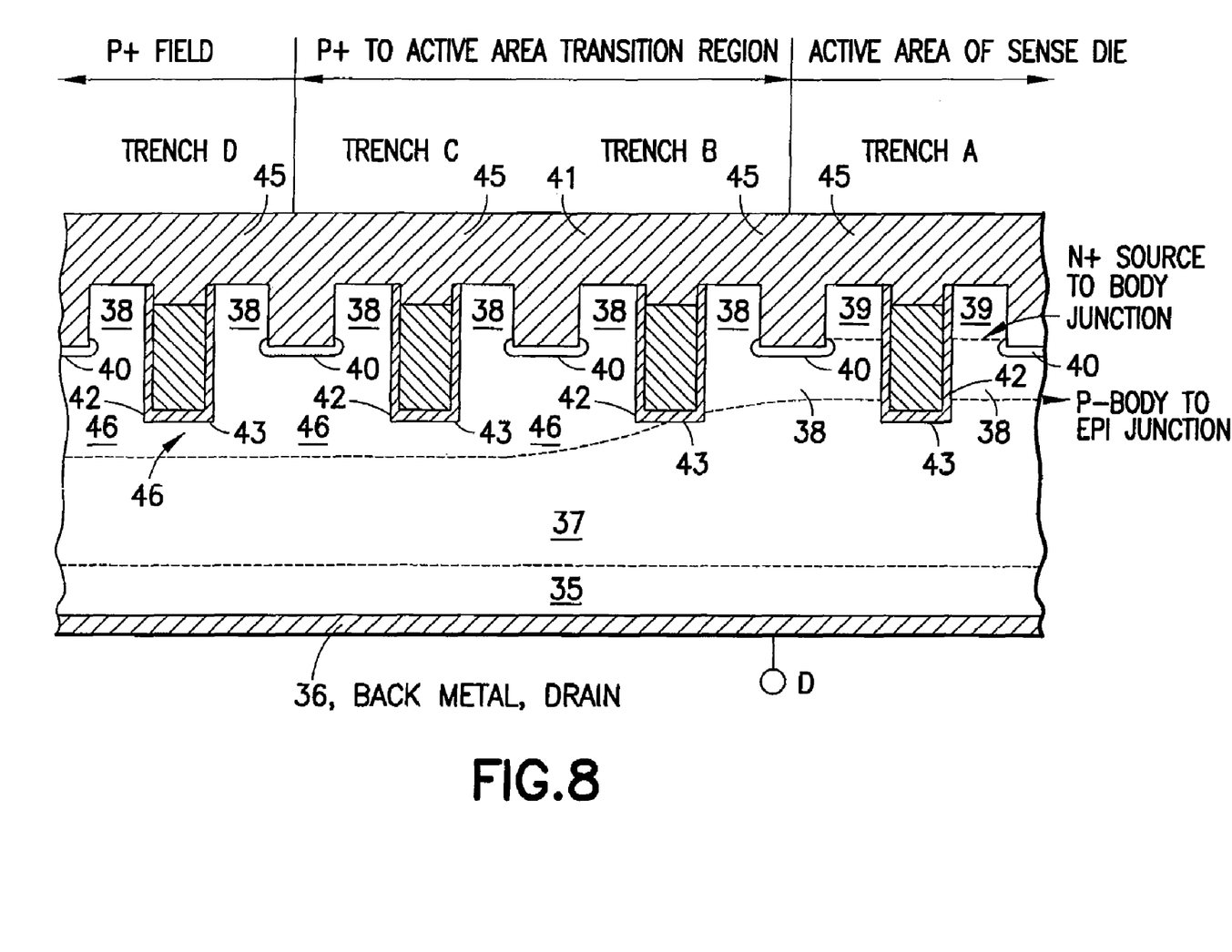
Figures 9A, 9B, 9C:
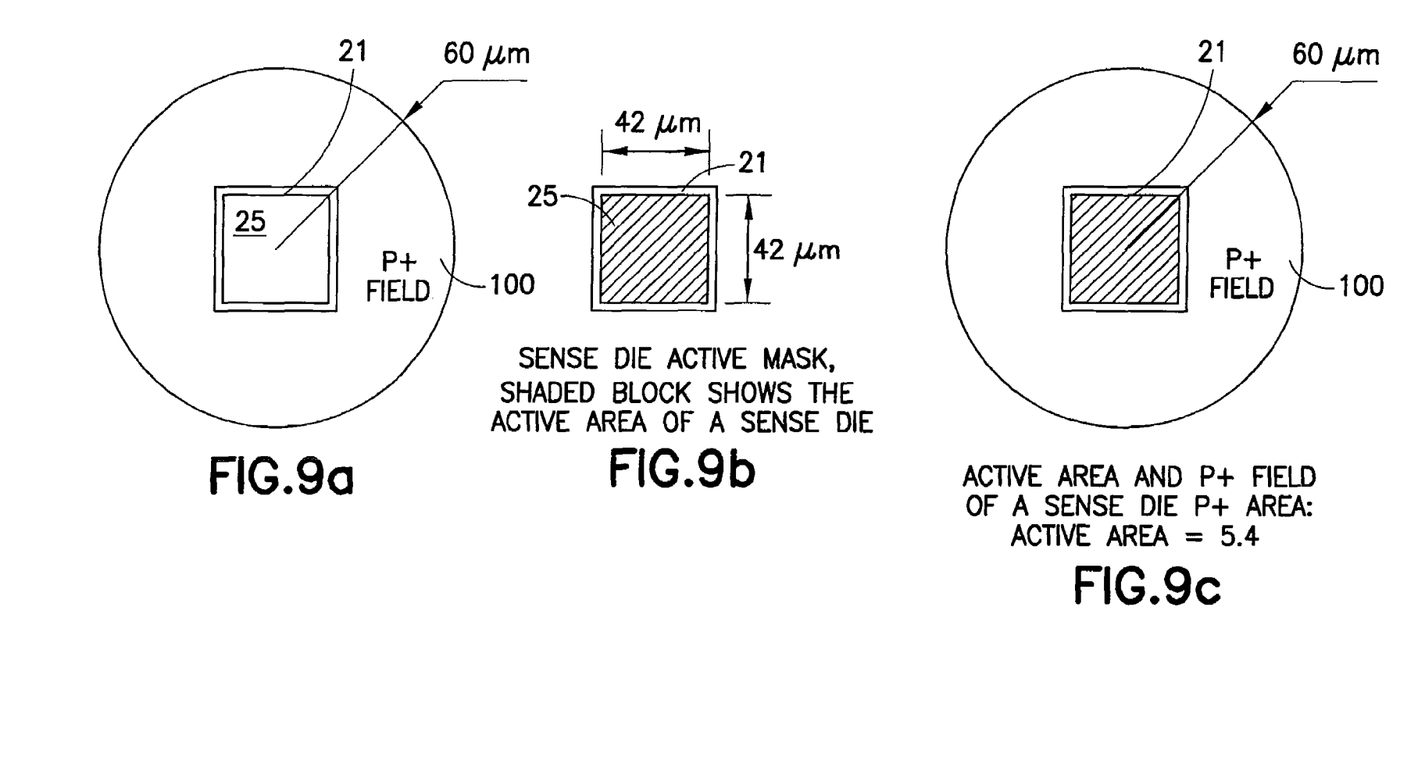
FIGS. 9a, 9b and 9c are top views of a further embodiment of the invention for the reduction of ESD sensitivity of the current sense die.

Current conduction, both perpendicular and parallel to the trenches and through the periphery of active area can be minimized with a source mask. This embodiment of the invention is shown in FIGS. 7a, 7b and 8 with trenches A, B, C and D retained. Compared to the prior art in FIGS. 1a, 1c and 2 where the source 3a is defined with the active mask, in this embodiment a source mask is added to define the N+ source implantation region exclusively within the active area. The periphery of the active area (the transition between the P+ field and the active area) has no N+ source region. Therefore, no current will be conducted in this region.

In accordance with this aspect of the invention, and in the 3 embodiments described,
1) This invention reduces the sense ratio variation under different gate voltages and among single wafers and fabrication lots. The invention makes fabrication related uncertainty to have minimum impact on the sense ratio, which is particularly critical for trench MOSFETs.
2) This invention enables the realizing of small sense ratio variation for high sense ratio devices (e.g., 12,000) with a small active area of the sense die (e.g. the order of 10 $\mu m^2$ or more).
3) This invention enables realizing small sense ratio variation in devices with micron or sub-micron cell pitch.
4) This invention could be adapted in any MOSFET platform without additional process steps and without additional cost. It is, therefore, a low cost solution for high quality current sense MOSFETs.

In a further aspect of the invention, the ESD withstand capability of a sense die is improved by increasing the gate-to-source (sense pin) capacitance of a sense die without increasing the active area. This is done by enlarging the P+ region at periphery of and surrounding the active area of a sense die. The enlarged P+ region forms a larger capacitor in parallel to the gate-to-source (sense pin) capacitance of the sense die. The greatly increased total gate-to-source (sense pin) capacitance of a sense die helps to improve ESD withstand capability of a current sensing MOSFET.

FIGS. 9a, 9b 9c and 10 show one embodiment of this invention. The active area 25 of the sense die is isolated from the main FET through a P+ transition region 21 in the earlier FIGS. 1a through 8. In this embodiment of the invention the P+ area is extended to a field area 100, which over 5 times larger than the active area 25 of a sense die. For comparison, a prior art sense die design, has a ratio of P+ area to active area of approximately one. The P+ region 100 is connected to the P body and a source potential. A poly silicon layer 101 connected to the gate bus is located on top of the P+ region and is isolated from the P+ region by field oxide 102. A capacitor between the poly silicon gate 101 and source 102 of the sense die is formed that is in parallel to the gate-to-source (sense pin) capacitance of the active area of the sense die. The larger the P+ area, the larger the parallel capacitor is, and the better the ESD capability of a sense die will be. Moreover, the extended P+ field does not necessarily take up the active area of the main FET. Thus, the area underneath the wire bonding pads can be used as the P+ field area.

Figure 10:
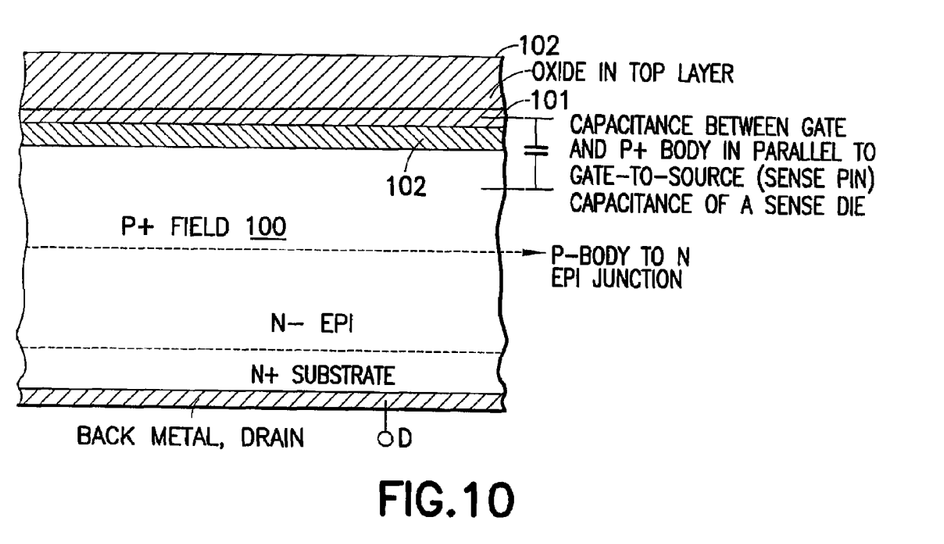
FIG. 10 is a cross-section of a die having the ESD protective P+ enlarged field of FIGS. 9a and 9c.

FIG. 10 shows a cross-sectional view of the P+ field 100 that forms the poly silicon gate 101 to P+ body 100 (connected to source) capacitor across field oxide 102.

Figure 11:
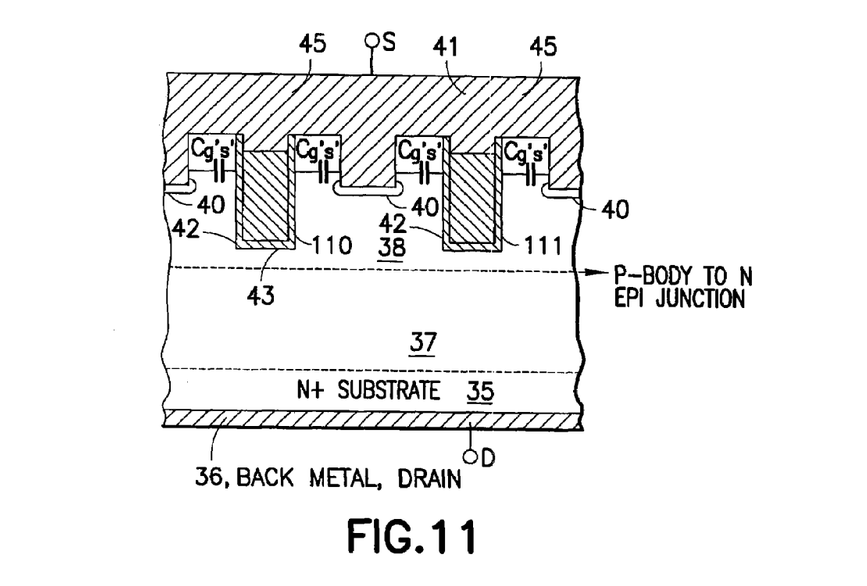
FIG. 11 is a cross-section of a further embodiment of the invention for reducing ESD sensitivity.

Another embodiment of this invention is to add multiple dummy trenches 110, 111 at the P+ region to further increase the parallel gate-to-source (sense pin) capacitance. A cross-sectional view of this embodiment is shown in FIG. 11. The poly silicon 43 inside the dummy trenches is connected to the gate of the trenches of the active area through the common poly silicon gate bus. The P bodies 38 of the dummy trenches are connected to the source metal 41. In addition to the P+ field to poly-silicon capacitance across field oxide, the dummy trenches form multiple parallel capacitors Cgs across the gate oxide between the poly silicon gate inside the trenches to the source. Since the gate oxide is typically much thinner than the field oxide e.g., 600 Å vs. 3000 Å). The dummy trenches can increase the gate-to-source capacitance significantly. The dummy trenches will not turn-on due to the lack of an N+ source layer.

This invention of FIGS. 9a to 11 does not require additional process steps or increased process cost. Further, this invention does not use up the active area of the main FET. Therefore, it is an economic and effective method to improve sense die ESD withstand capability.

The structure of FIGS. 9a to 11 provides the following advantages:
1) This invention improves the ESD withstand capability of a sense die by increasing the gate-to-source (sense pin) capacitance of a sense die.
2) This invention does not require extra silicon area; the active area of the main FET is not affected.
3) This invention improves assembly yield of a current sensing MOSFET. Yield otherwise may decrease due to ESD damage in handling.
4) This invention improves the reliability of current sensing MOSFETs that are otherwise prone to ESD destruction.
5) This invention can be adapted in any MOSFET platform without additional process steps and additional cost. It is, therefore, a low cost solution for current sensing MOSFETs ESD improvement.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:
1. A MOSgated trench device comprising:
spaced source and drain regions;
a first trench and a second trench;
an active area surrounded by a transition region, said transition region includes a first region adjacent one edge of said active area and extending continuously between said active area and a first edge of said transition region and a second region adjacent another opposing edge of said active area and extending between said active area and a second edge of said transition region, each said first trench and said second trench being disposed outside said transition region and each said first trench and said second trench being lined with gate insulation and filled with a conductive body; and
a plurality of parallel MOSgate trenches extending across said active area and each including a source region adjacent a respective sidewall thereof; said MOS gate trenches each containing a respective MOSgated structure that turns on in response to a gate signal applied to said MOSgated structures; wherein
said first region and said second region of said transition region on opposite sides of said active area are free of a MOSgated structure and rendered inoperable to prevent contribution to the total conduction of said MOSgated trench device when a gate signal is applied to said MOSgated structures to turn said device on.
2. The device of claim 1, wherein said die is a current sense die having less than about 1/1000th of the total area of a main MOSFET with which said current sense die cooperates.

3. The device of claim 2 wherein said die has an active area less than about 100 mm².

4. A MOSgated trench device comprising:
spaced source and drain regions;
an active area surrounded by a transition region; and
a plurality of parallel MOSgated trenches extending across said active area and said transition region; said trenches each containing a respective MOSgated structure that turns on in response to a gate signal applied to said MOSgated structures;
wherein said transition region is a $P^+$ region having an area greater than about three times the area of said active region to provide an increased capacitance from gate to source of said MOSgated device.

* * * * *